United States Patent [19]

Abbas et al.

[11] Patent Number: 4,513,303
[45] Date of Patent: Apr. 23, 1985

[54] SELF-ALIGNED METAL FIELD EFFECT TRANSISTOR INTEGRATED CIRCUIT

[75] Inventors: Shakir A. Abbas, Wappingers Falls; Ingrid E. Magdo, Hopewell Junction, both of N.Y.

[73] Assignee: International Business Machines Corporation, Armonk, N.Y.

[21] Appl. No.: 405,811

[22] Filed: Aug. 6, 1982

Related U.S. Application Data

[62] Division of Ser. No. 167,253, Jul. 8, 1980, Pat. No. 4,359,816.

[51] Int. Cl.³ .................. H01L 29/94; H01L 29/76
[52] U.S. Cl. .................... 357/23.3; 357/59; 357/51; 357/50; 357/23.9; 357/71; 357/68; 357/23.6
[58] Field of Search ............ 357/49, 23 SC, 23 CS, 357/68, 59, 71, 50, 23 S, 23 C

[56] References Cited

U.S. PATENT DOCUMENTS

| 4,037,307 | 7/1977 | Smith ..................... 357/23 S |
| 4,209,349 | 6/1980 | Ho et al. .................. 357/49 |
| 4,209,350 | 6/1980 | Ho et al. .................. 357/49 |

Primary Examiner—William D. Larkins
Assistant Examiner—Charles S. Small, Jr.
Attorney, Agent, or Firm—George O. Saile

[57] ABSTRACT

A self-aligned metal field effect transistor is described which achieves self-aligned metal to silicon contacts and submicron contact-to-contact and metal-to-metal spacing for field effect transistor integrated circuits. The insulation between the contacts and the metal is a pattern of dielectric material having a thickness dimension in the order of a micron or less. The metal and dielectric structure is substantially planar.

5 Claims, 28 Drawing Figures

SELF-ALIGNED METAL FIELD EFFECT TRANSISTOR INTEGRATED CIRCUIT

This is a division of application Ser. No. 167,253 filed July 8, 1980, now U.S. Pat. No. 4,359,816.

DESCRIPTION

1. Technical Field

The invention relates to methods and resulting structures for manufacturing field effect transistor integrated semiconductor devices and, more particularly, to a self-aligned metal field effect transistor structure which achieves self-aligned metal-to-silicon contacts and submicron contact-to-contact and metal-to-metal spacing wherein the insulation between the contacts is a pattern of dielectric material having a thickness dimension in the order of a micron or less.

2. Cross References to Related Patent Applications (1) Patent application Ser. No. 167,184 filed like date entitled "Self-Aligned Metal Process for Integrated Circuit Metallization" by G. R. Goth, I. E. Magdo, and S. D. Malaviya.

(2) U.S. Pat. No. 4,322,833 filed like date entitled "Self-Aligned Metal Process for Integrated Injection Logic Integrated Circuits" by S. A. Abbas and I. E. Magdo.

(3) Patent application Ser. No. 167,172 filed like date entitled "Self-Aligned Metal Process for Field Effect Transistor Integrated Circuits Using Polycrystalline Silicon Gate Electrodes" by C. G. Jambotkar.

BACKGROUND ART

Semiconductor integrated circuits have substantially increased in density in the past decade. However, there is an increasing demand for greater complexities, higher switching speeds and smaller devices for new applications, such as microprocessors and minicomputers. The field effect transistor technology is dominant in main memory and lower performance logic and arrays because of its higher circuit density and simpler processing as compared with bipolar technology.

A very active area in the semiconductor fabrication technology has been the generation and application of fine lines in the lithographic technology. Light had been used almost exclusively until the recent past in the lithographic process. However, optical resolution limits make further advances in line widths much more difficult. The most important and versatile among the technologies for the future reduction in line widths are electron beam and X-ray exposure processes. The lithography problem and their possible solutions are discussed in greater detail by D. L. Critchlow in the publication entitled "High Speed MOSFET Circuits Using Advanced Lithography", published in the *Computer*, Vol. 9, No. 2, February 1976, pp. 31 through 37. In that publication the substantial equipment costs and complexities of X-ray and electron beam lithography are described.

There have been alternative efforts to obtain narrow line widths in the range of one micrometer or less by extending standard photolithography techniques and avoiding the need for the more expensive and complex techniques, such as electron beam or X-ray lithography. One such technique is described by H. B. Pogge in IBM Technical Disclosure Bulletin, November 1976, Vol. No. 6, entitled "Narrow Line Widths Masking Method". This method involves the use of a porous silicon followed by oxidation of porous silicon. Another technique is described by S. A. Abbas, et al, IBM Technical Disclosure Bulletin Vol. 20, No. 4, September 1977, pp. 1376 through 1378. This TDB describes the use of polycrystalline silicon masking layers which are made into masks by first using an intermediate mask of oxidation blocking material, such as silicon nitride in the formation of the polycrystalline silicon. Line dimensions below about two micrometers may be obtained by this technique. T. N. Jackson, et al, described "A Novel Sub-micron Fabrication Technique" in the March 1980 publication *Semiconductor International*, pp. 77 through 83, a method for producing sub-micron line widths and devices which do not require electron beam lithography but used a selective edge plating technique. The U.K. Patent 2,003,660 published Mar. 14, 1979 describes a method for depositing an area of metal, for example metal on a substrate and forming narrow metal stripes thereby by using a unidirectional plasma etching technique. K. H. Nicholas, U.S. Pat. No. 4,083,098 describes a method of making a plurality of closely spaced, but air isolated, conductive layers on an insulated substrate. He suggests no ohmic connections to the silicon body under the insulator supporting his conductive layers. These above techniques do show ways of forming narrow lines on substrates but lack an overall solution for their successful use in the manufacture of semiconductor devices, because it is unclear how they will be used to contact actual device elements within the semiconductor substrate in an accurate and effective manner. Further, there are problems of planarity of the first level metallurgy and adequate conductivity of the metallurgy at that level.

The patent application of H. B. Pogge, Ser. No. 957,604 filed Nov. 3, 1978, entitled "Method for Forming a Narrow Dimensioned Region on A Body" and the patent application of J. Riseman Ser. No. 957,606 filed Nov. 3, 1978, entitled "Method for Forming An Insulator Between Layers of Conductive Material" describe techniques for forming narrow dimensioned, for example submicron regions on a semiconductor body that involves forming on the silicon body regions having substantially horizontal surfaces and substantially vertical surfaces. A layer of a very narrow dimension is formed both on the substantially horizontal and substantially vertical surfaces. Reactive ion etching is applied to the layer to substantially remove the horizontal layer while leaving the vertical layer substantially intact. The vertical layer dimension is adjusted depending upon the original thickness of the layer applied. The patent applications more importantly describe techniques for using this narrowed dimensioned region in a semiconductor device fabrication process for various types of integrated circuit structures such as field effect devices.

A major problem in very dense integrated circuits is the electrical contacts to the various elements and devices in the semiconductor integrated circuits. A problem involves the conductivity of the metallurgy at the various levels as the device density increases. In recent times, solutions to these problems have taken the direction of the use of highly doped polycrystalline silicon as conductive layers such as shown in R. C. Wang, U.S. Pat. No. 3,750,268, issued Aug. 7, 1973 and R. T. Simko, et al U.S. Pat. No. 3,984,822, issued Oct. 5, 1976. However, as the density of devices has increased, there still remains problems involving isolation between devices, conductivity particularly at the first level of metallurgy contacting the semiconductor devices, and alignment of the levels of metallurgy to the device elements in the semiconductor integrated circuit.

In the usual methods for forming double polycrystalline silicon multilayer structures, silicon dioxide is used as the insulator between the layers. The silicon dioxide thickness between two polycrystalline layers is normally directly related to the thickness of the silicon gate oxide where a FET type device is being made. The usual thermal oxidation techniques are used to form the silicon dioxide layer.

It is the object of this invention to provide methods for forming an insulator of any desired thickess between the conductive layers, which may be metal or polycrystalline silicon, and, in particular, on the vertical regions between the layers of conductive material which are the electrical contacts to elements of field effect transistor integrated circuits.

SUMMARY OF THE PRESENT INVENTION

In accordance with the present invention, a self-aligned metal process is described which achieves self-aligned metal or polycrystalline silicon contacts and micron-to-submicron contact-to-contact and metal-to-metal spacing by use of a pattern of dielectric material having a thickness of the order of a micron or less. The process results in a substantially planar structure. The first level metallurgy can be any desired metal such as aluminum, aluminum-copper, polycrystalline silicon, metal silicide, or the like for electrical contact to the elements of the field effect transistor integrated circuits.

The method for forming integrated circuits having a pattern of narrow dimensioned dielectric regions on a monocrystalline semiconductor, preferably silicon, body involves providing the silicon body and forming a first insulating layer on a major surface of the body. A polycrystalline silicon layer is then formed on the first insulating layer. Openings in the polycrystalline layer are made using directional reactive ion etching which results in a structure having substantially horizontal surfaces and substantially vertical surfaces. The openings can be either in the areas designated to be the gate regions or a PN junction regions of the field effect transistors in the integrated circuit. A second insulating layer is then deposited on both said substantially horizontal surfaces and said substantially vertical surfaces. The thickness of the second insulator layer is the desired thickness of the narrowed dimensioned dielectric regions to ultimately be formed on the semiconductor, or preferably silicon body. The structure is placed in a reactive ion etching ambient where the second insulating layer is substantially removed from the horizontal surfaces and has no signifiant effect on the insulating layer on the vertical regions of the polycrystalline silicon. The gate dielectric is either formed hereat or PN junctions are fabricated by diffusion or ion implantation techniques. The remaining polycrystalline silicon regions are then removed by etching to leave the self-standing narrow dimensioned dielectric regions on the silicon body surface. A conductive layer of one or more wide variety of possible materials is now blanket deposited upon the narrow dimensioned regions and on the silicon body to make contact to source/drain PN regions and form the gate electrodes. Where the conductive layer is formed upon bare silicon, ohmic contacts can be formed thereto. A plastic material, such as a polyimide or photorsist, is deposited over this conductive layer to planarize the surface thereof. The structure is then placed in a reactive ion etching ambient where the conductive layer is uniformly etched together with the plastic layer until the tops of the narrow dimensioned regions are reached. Alternatively, a portion of the plastic material can be left over the major horizontal surface after the reactive ion etching while exposing the metal peaks. Then wet etching the exposed metal peaks breaks the metal continuity and exposes the narrow dimensioned regions under the metal peaks. The remaining plastic material is then removed to thereby form the substantially planar conductive layer with narrow dimensioned dielectric isolation separating portions of the conductive layer.

The method can be used to form a variety of field effect transistor products. These structures are formed by appropriate modifications of the method described in the preceding paragraph to form suitable PN junctions, gate dielectric and electrode structures, PN contact regions, together with openings to the semiconductor body which have these elements formed therein. The conductive layer with the narrow dimensioned dielectric pattern to electrically isolate the various regions of the conductive layer are formed according to the methods described above. Logic and memory field effect transistor integrated circuits may be formed according to these method to provide the beneficial results of high density with suitable conductivity of the metallurgy layers and good planarity with its attendant yield and reliability.

DISCLOSURE OF THE INVENTION

Figure 1A:
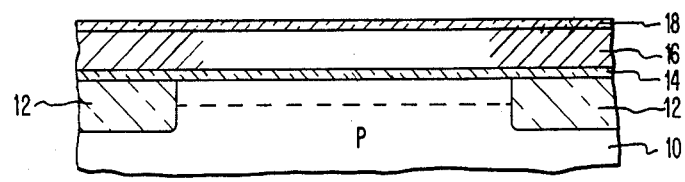
FIGS. 1A through 1F illustrate a first method embodiment for forming a field effect integrated circuit device according to the present invention.

Referring now more particularly to FIGS. 1A through 1F there is illustrated a first embodiment for utilizing the self-aligned metal process to form field effect transistor integrated circuits. The process is illustrated to form N channel MOSFET field effect transistor integrated circuits. However, it would be obvious that P channel field effect transistors can alternatively be formed by simply reversing the polarities of the various elements of the transistors and associated regions. The FIG. 1A illustrates one small, greatly enlarged portion of a silicon body which will be used to form a very dense field effect transistor integrated circuit structure. P type substrate of monocrystalline silicon substrate 10 having a 10–20 ohm-cm resistivity is the basic foundation structure for the process. P+ substrates with low doped P epitaxy can also be utilized.

The first series of method steps involve the formation of isolation means for isolating regions of monocrystalline silicon from other regions of monocrystalline silicon in substrate 10. The isolation may preferably be partial dielectric isolation using materials such as silicon dioxide, glass, etc. The preferred pattern of partial dielectric isolation 12 define monocrystalline silicon surface regions wherein field effect devices will ultimately be formed. There are many ways in the art to form dielectric isolation regions of this type. It is preferred to use the process described in the Magdo et al patent application Ser. No. 150,609, filed June 7, 1971, or Peltzer U.S. Pat. No. 3,648,125. Alternatively, the process described in the J. A. Bondur et al U.S. Pat. No. 4,104,086 can be used. In that patent application and patents the processes for forming partial dielectric isolation regions 12 are described in detail.

A first insulating layer 14 is formed over the surface of the silicon body. This first insulating layer 14 may be a layer composed of silicon dioxide, silicon nitride, aluminum trioxide, or the like, or combinations of the foregoing. The layer may be thermally grown in oxygen or oxygen-water vapor ambient at a temperature of 970° C. to form a thermal silicon dioxide layer. A second method for growing silicon dioxide involves the use of chemical vapor deposition process herein $SiH_4$, $O_2$ at about 450° C.; or $SiH_2Cl_2$ and $N_2O$ at a temperature of about 800° C. under atmospheric or low pressure conditions. The deposition of silicon nitride is usually formed by chemical vapor deposition using the following process conditions: $SiH_4$, $NH_3$ and $N_2$ carrier gas at a temperature of about 800° C. under atmospheric or low pressure conditions as described, for example, in the V. Y. Doo U.S. Pat. No. 4,089,992. The insulating layer 14 may be, as an example, thermally grown silicon nitride of about 500 Å thickness.

The surface conductivity is adjusted in the regions where the field effect transistors are to be formed. The threshold, $V_T$, is adjusted by using boron, ion implantation of $6 \times 10^{11}/cm^2$ dosage at approximately 70 KeV.

A coating 16 of polycrystalline silicon is now deposited over the entire wafer by using, for example, silane in a hydrogen ambient in a temperature range of about 500° to 1000° C. The operative thickness of the polycrystalline silicon is between about 7,000 to 12,000 Angstroms with 10,000 Angstroms preferred. Generally, it is desired that the first polysilicon layer be approximately equal to the metal thickness. If it is much higher, the studs protrude too much over the metal resulting in non-planarity of first level. If the studs are too low, planarization and the breaking of the metal is more difficult to achieve. The polycrystalline silicon layer makes no electrical contact to the silicon body 10 since it is formed upon the first insulating layer 14. A silicon nitride layer 18 which may be, for example, about 1,500 Angstroms in thickness is deposited by chemical vapor deposition according to the following conditions: by decomposing $SiH_4$ and $N_2$ at 800° C. Other insulating layers or combination of layers can be substituted for the silicon nitride. Standard photolithography and etching techniques may be utilized to form openings in this silicon nitride layer 18 over the areas designated to be gate regions of the integrated circuit. Using this silicon nitride mask the structure is placed in a reactive ion or plasma etching environment for a polycrystalline having typically the conditions as follows: for example, $CF_4$/Argon, $Cl_2$/Argon or $CCl_4$/Argon, $SF_6$ or $SF_6 + Cl_2$, RF parallel plate structure about 10 microns pressure, 0.16 watts/cm² power density and 10 cc/min. flow rate and using the apparatus described in the Harvilchuck, et al patent application Ser. No. 594,413 filed July 9, 1975 and continuation patent application Ser. No. 822,775 filed Aug. 8, 1977. The reactive ion etching process is completed when it reaches the first insulating layer 14. The resulting structure has horizontal surfaces 20 and vertical surfaces 21.

Figure 1B:
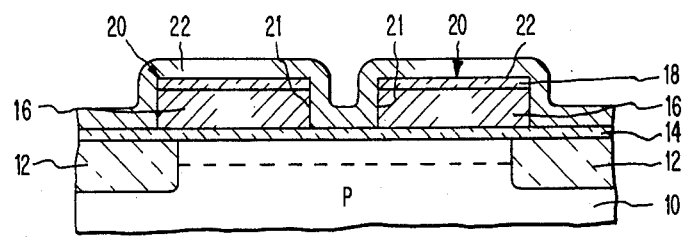

A conformal layer 22 is deposited on both the substantially horizontal surfaces 20 and the substantially vertical surfaces 21 to produce the structure of FIG. 1B. This conformal layer 22 is typically formed by chemical vapor deposition. This conformal layer must be, as formed, an electrical insulator or capable of being changed to an insulator. The layer 22 may be one of several insulating materials, such as silicon dioxide, silicon nitride, aluminum trioxide and combinations of these materials with polycrystalline silicon. The conformal layer 22 utilized in the present embodiment is silicon dioxide having a thickness of between about 3,000 to 10,000 Angstroms and preferably about 6,000 Angstroms.

Figure 1C:
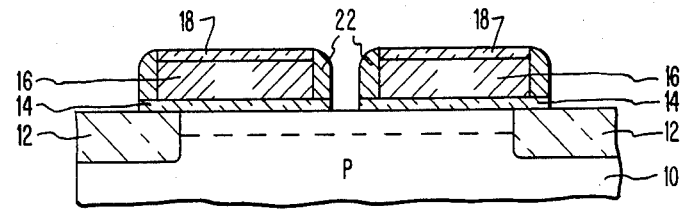
Figure 1D:
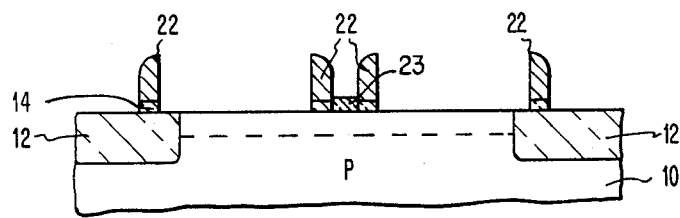

The FIG. 1B structure is placed into a suitable reactive ion etching ambient for the material of the conformal layer 22. For example, in etching silicon dioxide, the conditions are such that an etch ratio of about 10 to 1 silicon dioxide to silicon is desirable. Overetching is needed to be sure all of the silicon dioxide is removed from the horizontal surfaces and/or an etched stop indicator is utilized. The reactive ion etching process substantially removes the horizontal portion of the layer 22 and provides the pattern of narrow dimensioned vertical regions on the silicon body which is shown in FIG. 1C. As shown in FIG. 1C the first silicon dioxide insulating layer 14 was removed by the reactive ion etching step.

The FIG. 1C is now subjected to thermal oxidation ambient so as to reform the silicon dioxide gate dielectric. The thickness of the gate dielectric may be between about 200 to 500 Angstroms, and preferably is approximately 450 Angstroms in thickness. The silicon nitride layer 18 is removed using hot phosphoric acid, $H_3PO_4$. The gate dielectric is protected for further processing by the use of a spin coating of a polyimide or a resist material and etching back by use of reactive ion etching to expose the polysilicon layer 16 and the silicon dioxide layer 22. The polyimide of resist mask (not shown) is present to mask the silicon dioxide gate. The structure is placed in a reactive ion etching ambient for polycrystalline silicon to remove in the areas designated to be the source and drain regions and where otherwise not protected. With the polyimide still in place the $SiO_2$ is reactive ion etched in the source and drain regions, leaving the gate $SiO_2$ dielectric protected by polyimide.

The next step is to form the source/drain diffusion or ion implantation to cause the formation of the N+ regions 24 and 25. Where the thermal diffusion process is to be utilized for N type impurity, such as arsenic or phosphorus, the surface will be bare of any insulator. The preferred dopant is phosphorus which is diffused into the source/drain regions by $POCl_3$ diffusion at approximately 900°–950° C. for about 60–120 minutes. Where it is desired to ion implant impurities into the body to form the source/drain regions 24 and 25, it is preferable to implant these impurities through a thin insulating screen silicon dioxide layer (not shown). The thin silicon dioxide may be grown by a thermal oxidation cycle. The structure is then placed in an ion implantation apparatus wherein impurities such as arsenic, phosphorus, or the like, pass through the screen layer (not shown) to form ion implanted regions in the source/drain areas. The gate dielectric is protected by polyimide. The conditions of such ion implantation process are phosphorus dosage of $5 \times 10^{15}/cm^2$ at 100 KeV power. The polyimide now is removed. A drive-in step involves a temperature of about 900°–1000° C. in a non-oxidizing atmosphere to complete the formation of the source/drain regions 24 and 25. During diffusion the gate dielectric is protected by 450 Angstroms of $SiO_2$. The screen oxide is either etched in buffered HF solution, or reactive ion etched.

A blanket metal layer is deposited over the narrow dimensioned dielectric regions 22 and areas therebetween so that in the areas between the narrow dimensioned dielectric regions that have contact openings to the PN junction elements, such as source/drain 24 and 25, in the silicon body may ohmically contact such regions. The structure is substantially quite non-planar because the blanket metal layer will form a hill like formation above the narrow dimensioned dielectric regions 22. The preferred metal layer is formed of aluminum-copper by evaporation or sputtering. Other metals which may be utilized as the blanket metal are aluminum, chromium/aluminum-copper. The non-planar blanket metallized structure is planarized by a blanket deposition of a plastic material over the metal layer; this plastic material can be typically a photoresist or a polyimide material, or the like. The plastic material is spun on the surface of the wafer in known manner like 4500 rpm for 100 seconds. The polyimide is slow cured at 80° C. for 15 minutes and then 300° C. for 20 minutes. The planarized structure is placed in a reactive ion etching ambient. The etchback is performed in an oxygen ambient at 100 microns of Hg of oxygen and 0.25 watts/$cm^2$. The reactive ion etching uniformly etches the plastic and the metal layer until the tops of the narrow dimensioned dielectric regions 22 are reached. The remaining plastic material is removed, for example, oxygen ashing or other suitable processes. Alternatively, a portion of the plastic material can be left over the major horizontal surface after the reactive ion etching while exposing the metal peaks. Then wet etching the exposed metal peaks breaks the metal continuity and exposes the narrow dimensioned regions under the metal peaks. The plastic masking material is then removed. The result of the process is a substantially planar structure of FIG. 1E wherein the source/drain metal contacts are 26 and 27 and the gate electrode is 28. The other metal regions 29 and 30 are either contacts from other devices or just floating, that is not electrically connected, metal.

Figure 1E:
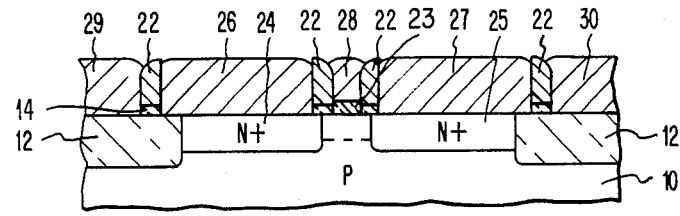
Figure 1F:
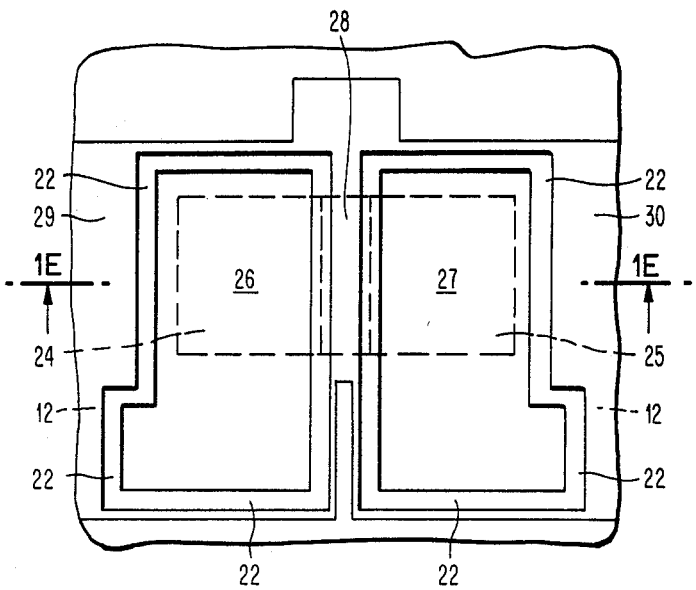

The top view of the cross-sectional structure of FIG. 1E is shown in FIG. 1F. FIG. 1E is taken along 1E:1E of FIG. 1F. The metal lift-off process can be used to define the metal patterns. The lift-off process may be better understood with reference to J. R. Franco, et al, U.S. Pat. No. 4,004,044 which is one example of such a process. Since metal width and metal-to-metal separation determines the size of the device in previous techniques, here the device size is dictated mainly by the lithography of the silicon processes. Also, planar first level metal is achieved. Higher densities can be obtained for the same lithographic ground rules. In addition, 100 percent coverage of diffusions and gate regions is obtained.

Figure 2A:
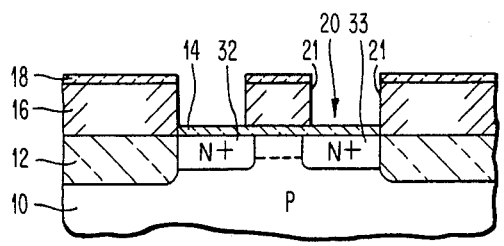
FIGS. 2A through 2D show a second method embodiment for forming a field effect transistor integrated circuit device according to the present invention.
Figure 2B:
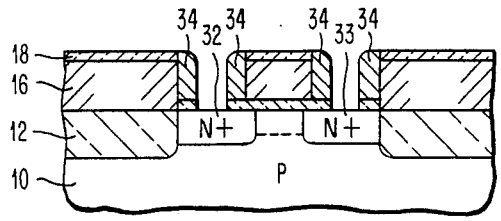
Figure 2C:
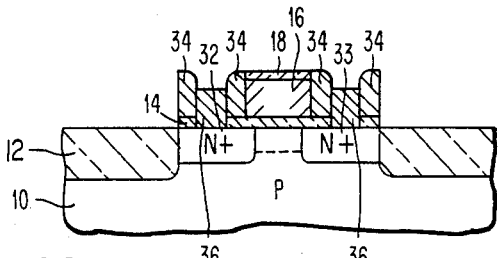
Figure 2D:
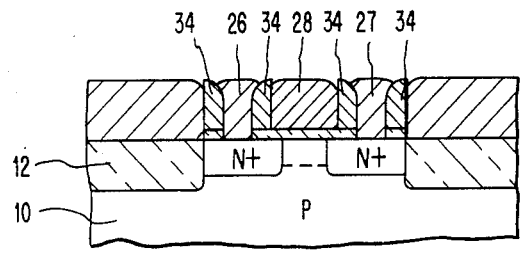

Referring now more particularly to FIGS. 2A through 2D, a second method embodiment is described. The process for forming the recessed dielectric isolation 12 on the surface regions of P silicon substrate 10 to isolate monocrystalline silicon regions designated to be sites for field effect transistor devices is formed according to the procedures described in the relation to the FIG. 1A through FIG. 1F embodiment. Like numbers are indicative of like structures to the FIG. 1A through FIG. 1F embodiment. The first insulating layer 14, polycrystalline silicon layer 16 and silicon nitride insulating layer 18 are applied to the major surface of the silicon body according to the same procedures described in regard to the FIGS. 1A through 1F embodiment. In this particular embodiment the first insulating layer 14 is grown to the desired thickness of the gate dielectric which is preferably about 450 Angstroms in thickness. Photolithography and etching techniques are utilized to form openings in silicon nitride layer 18 over areas designated to be the PN junction regions, such as source/drain PN regions of the field effect transistor integrated circuits. The structure is placed in a reactive ion etching ambient, as described in regard to the first embodiment, to reactively ion etch the structure so that there are resulting substantially horizontal surfaces and substantially vertical surfaces 20 and 21, respectively. The reactive ion etching step ends at the first insulating layer 14, as shown in FIG. 2A. The source/drain region is preferably formed by ion implantation utilizing the layer 14 as the screen oxide. The N+ source/drain regions 32 and 33 are formed according to the method described in the first embodiment above. The narrow dimensioned dielectric regions 34, shown in FIG. 2B, are formed according to the identical procedures described in the first embodiment. It is noted that the distinction in this second embodiment over the first embodiment is that the gate dielectric remains covered with the polycrystalline silicon layer 16 throughout the processing, and the source/drain regions are initially opened. The silicon nitride insulating layer 18 is now removed using a suitable etchant as described above. The source/drain regions 32 and 34 are protected with a plastic material such as polyimide as described in relation to the first embodiment in the protection of the gate dielectric. The protective layer of the polyimide is indicated at 36. The remaining polycrystalline silicon layer 16 is then removed by reactive ion etching. The polyimide layers 36 are then removed using oxygen ashing. The formation of the conductive layer on the silicon body with portions thereof electrically separated by the narrow dimensioned regions 34 is now accomplished as described in regard to the first embodiment of FIGS. 1A through 1F. The source/drain contacts are 26 and 27, and the gate electrode is 28.

Figure 3A:
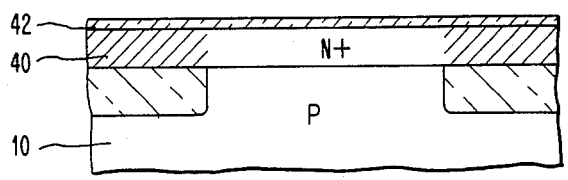
FIGS. 3A through 3D show a third method embodiment for forming a field effect transistor integrated circuit according to the present invention.
Figure 3B:
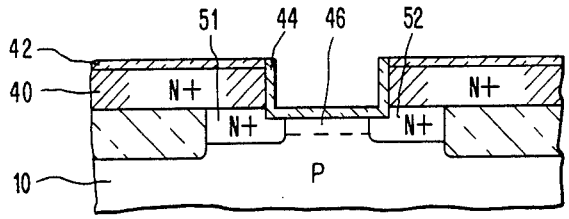
Figure 3C:
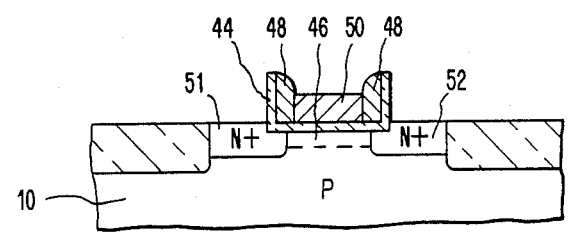

Referring now particularly to FIGS. 3A through 3D, a third embodiment for forming field effect transistor integrated circuits is illustrated. Like numbers indicate like structures to the proceeding embodiments. The recessed oxide insulation regions 12 are formed in the P substrate 10 as described in the embodiments of FIG. 1A through 1F to delineate where monocrystalline silicon regions where field effect transistors are to be formed. In this embodiment no first insulating layer is deposited on the major surface as was done in the first two embodiments. A polycrystalline silicon layer 40 is deposited directly upon the recessed oxide isolated monocrystalline regions of silicon. Insulating layer 42 is deposited over the polycrystalline silicon layer 40. This insulating layer is preferred to be silicon nitride having a thickness of between about 500 to 1,500 Angstroms and preferably about 1500 Angstroms. The polycrystalline silicon layer 40 is doped with N+ dopant such as phosphorus to a concentration of about $1 \times 10^{20}$ atoms/cc. This layer of polycrystalline silicon is either doped as formed or may be deposited undoped and ion implanted to provide the proper doping concentration. The preferred thickness of the polycrystalline silicon layer 40 is between about 8,000 to 12,000 Angstroms and preferably approximately one micrometer. Photolithography and etching techniques are utilized to form openings in the silicon nitride layer 42 in the regions designated as the gate regions of the field effect transistor integrated circuits. The structure is then placed in a reactive ion etching ambient as described above in regard to the first embodiment of FIGS. 1A through 1F and the polycrystalline silicon layer 40 is removed in the area designated as the gate regions, as shown in FIG. 3B. The reactive ion etching proceeds to the monocrystalline silicon surface. The structure is then placed in an oxidizing atmosphere of oxygen or oxygen-water at a temperature of about 900° to 970° C. to form a silicon dioxide layer 44. This thermal silicon dioxide growth is continued to the gate dielectric thickness which is preferred to be about 450 Angstroms. A threshold voltage adjust ion implant is now used to form the ion implanted region 46 in the channel region of the field effect transistors. The purpose of the threshold adjust is to increase the level of doping in the gate region and thereby increase the threshold voltage by a controlled amount. The increase in the doping level can be done by implanting boron with a dose in the region of $1 \times 10^{12}$ to $1 \times 10^{13}$ atoms/cc with energies in the range of 30 KeV to 60 KeV.

Figure 3D:
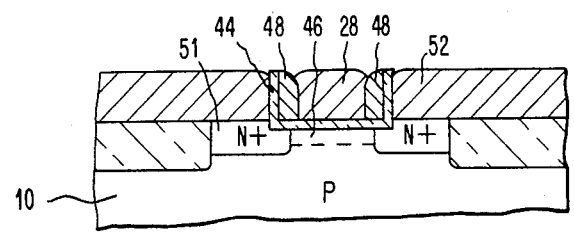

The formation of a pattern of narrow dimensioned dielectric regions 48 on the monocrystalline silicon body is accomplished according to the processes of the first and second embodiments. The structure is heated at a temperature sufficient to drive the N+ dopant from the polycrystalline silicon layer 40 into the regions designated to be the source and drain of the structure 51 and 52. The heating conditions are 900° to 1000° C. for 30 to 90 minutes. The plastic or polyimide layer 50 is formed to protect the gate dielectric region as described in the first and second embodiments above during the reactive ion etching removal of the remaining polycrystalline silicon layer 40. The process is continued to form a conductive layer on the silicon body which has portions thereof electrically separated by the narrow dimensioned regions 48 for contacting in self-alignment the sources 51, drains 52 and to form the gate electrode on the gate dielectric 44. The source electrical contact is 26; the drain electrical contact is 27 and the gate electrode is 28, as shown in FIG. 3D.

Figure 4A:
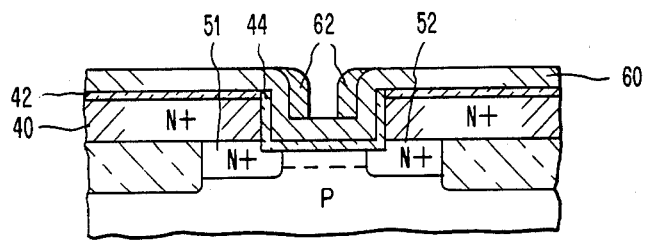
FIGS. 4A and 4B show a fourth method embodiment for forming a field effect transistor integrated circuit structure according to the present invention.
Figure 4B:
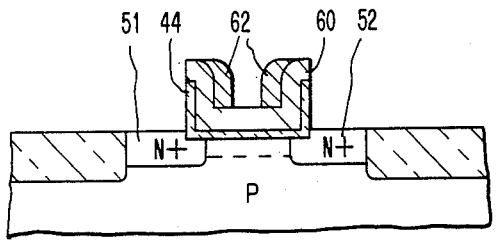
Figure 4C:
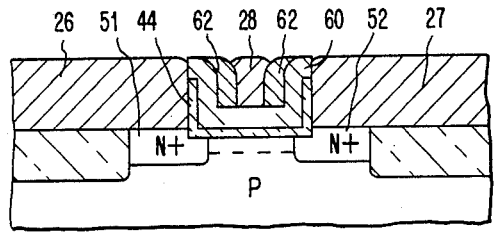

Referring now to FIGS. 4A through 4B, there is shown a fourth method embodiment for forming the field effect transistor integrated circuit of the present invention. Like numbers are indicative of like structures to that of the earlier embodiments. The process of the third embodiment, FIGS. 3A through 3D is followed through the formation of the thermal gate silicon dioxide layer 44. During this thermal oxidation the N+ dopant from the polycrystalline silicon layer 40 is driven-in to the silicon body 10 to form the source/drain regions 51 and 52. The process now changes with the addition of a conformal coating of polycrystalline silicon layer 60. This layer is formed according to the process described for forming polycrystalline silicon in the FIGS. 1A through 1F embodiment. The thickness of the layer is between about 2,000 to 6,000 Angstroms, and preferably 3,000 Angstroms. An insulator layer 62 is deposited over the polycrystalline silicon layer 60. This layer 62 is subjected to reactive ion etching to form the narrow dimensioned isolation regions, as shown in FIG. 4A. This process is identical to those described in regard to the other embodiments. The preferred material of this layer 62 is silicon dioxide which was deposited by chemical vapor deposition process. The gate dielectric is protected with a plastic material such as polyimide (not shown) as described in regard to the earlier method embodiments. Reactive ion etching is then used to remove the remaining silicon nitride layer 42, remaining polycrystalline silicon layer 40 and polycrystalline silicon layer 60, which is not protected by the silicon dioxide layers 62 and 44. The procedure of forming the conductive layer on the silicon body for contacting the source/drain regions 51 and 52, together with the formation of the gate electrode, proceeds as described in the earlier embodiments. FIG. 4B shows the structure after removal of the remaining polycrystalline silicon 40. FIG. 4C shows the final structure.

Figure 5A:
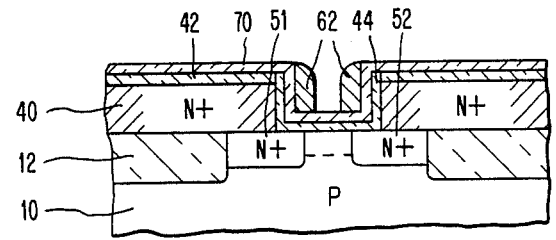
FIGS. 5A through 5C show a fifth method embodiment for forming a field effect transistor integrated circuit device according to the present invention.
Figure 5B:
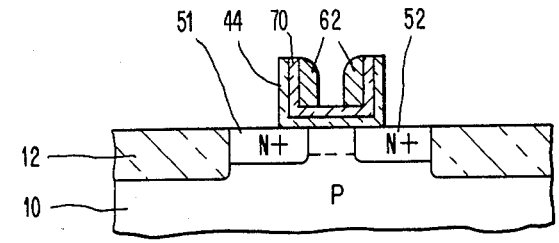
Figure 5C:
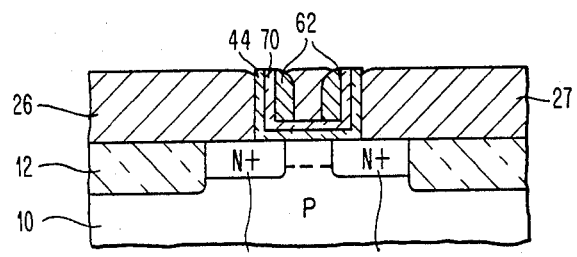

The method embodiment of FIGS. 5A through 5C is a variation of the FIGS. 4A through 4C embodiment. It differs from the embodiment where it is not defined to have a finished product with polycrylstalline silicon over the gate dielectric silicon dioxide. Therefore, the thick polycrystalline silicon layer of the order of 4,000 Angstroms is replaced with a thin layer 70 of polycrystalline silicon of the order of 500 Angstroms in thickness. The process then continues using the pyrolytic or chemical vapor deposited silicon dioxide layer 62 followed by the reactive ion etching step to form the pattern of narrow dimensioned dielectric regions 62, as shown in FIG. 5A. Reactive ion etching or pyrocatechol etch is used to remove the thin layer 70 of polycrystalline silicon. The silicon nitride layer 42 is removed by reactive ion etch or hot phosphoric. Next, the doped polycrystalline silicon is removed by reactive ion etch with an etch point detection on the silicon dioxide of the recessed oxidation. The conductive layer is then formed on the silicon body with portions thereof electrically separated by the narrow dimensioned regions 44, 62 and 70 for contacting in self-alignment the sources 51, drains 52 and forming in self-alignment the gate electrode for the integrated circuit. This is shown in FIG. 5C.

Figure 6A:
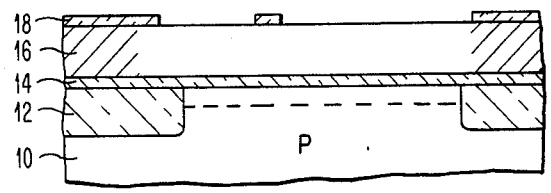
FIGS. 6A through 6H show a method embodiment for forming a self-aligned dynamic random access memory (RAM) cell using the field effect transistor integrated circuit technology according to the present invention.
Figure 6B:
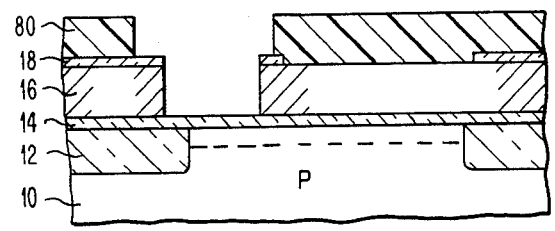
Figure 6C:
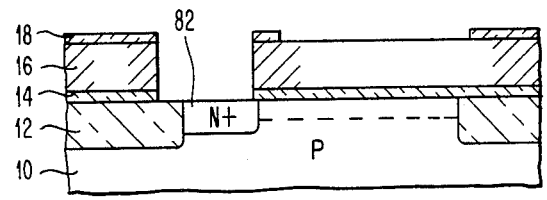
Figure 6D:
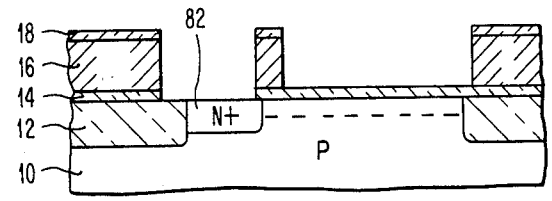
Figure 6E:
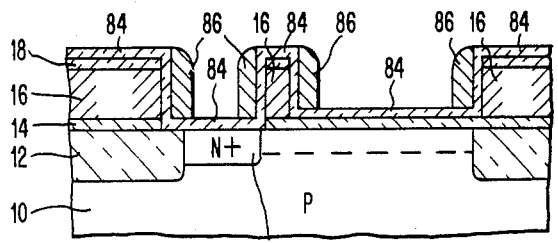
Figure 6F:
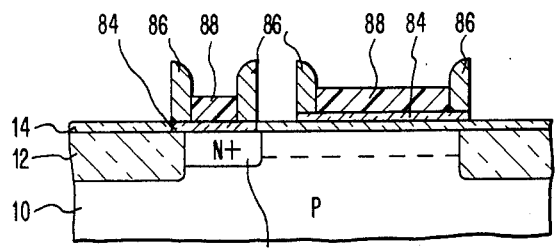
Figure 6G:
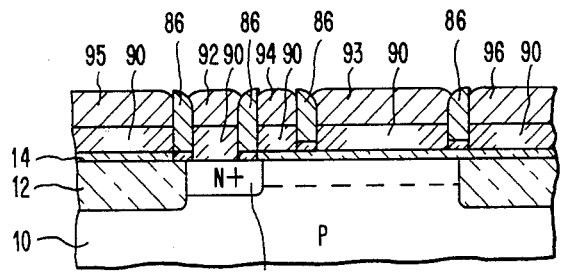
Figure 6H:
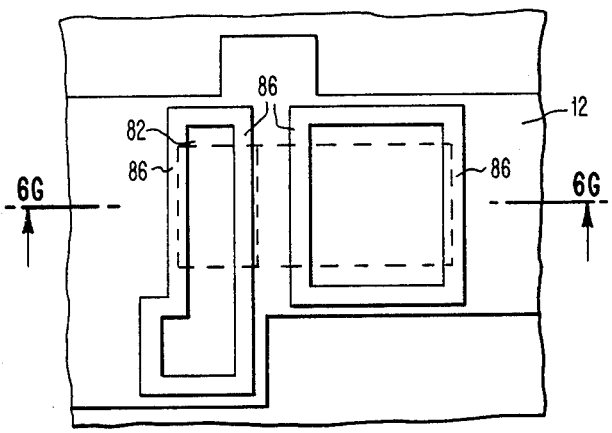

The embodiment illustrated by FIGS. 6A through 6H illustrates the fabrication of a dynamic random access memory (RAM) cell consisting of MOS field effect transistors plus a storage capacitor that uses the self-aligned metal process of the present invention. The initial part of the process follows the process of the first embodiment of FIGS. 1A through 1F wherein surface portions of the monocrystalline silicon body 10 are designated to have the field effect transistor and a capacitor therein are defined by recessed oxide isolation patterns 12. A first insulating layer 14 is formed over the surface; a polycrystalline silicon layer 16 is formed over the first insulating layer, and an insulating layer such as silicon nitride layer 18 is formed over the polycrystalline silicon layer 16. The first insulating layer 14 is formed having the thickness of the gate oxide which is approximately 450 to 500 Angstroms and a threshold voltage $V_T$, ion implantation adjustment is made according to the aforementioned first embodiment above. Lithography and etching techniques are utilized as described in conjunction with the first embodiment to form openings in the silicon nitride layer 18 where the designated drain region and capacitor regions are to be made. A lithographic block out mask is utilized to open the drain region and cover the capacitor region. This block out mask is shown as resist layer 80. The polycrystalline silicon layer 16 is reactive ion etched as described in conjunction with the first embodiment to produce the sidewall structure of substantially horizontal surfaces and substantially vertical surfaces, as illustrated in FIG. 6B. The drain is ion implanted through the screen silicon dioxide, the photoresist layer 80 is removed and the structure is annealed at a suitable temperature to form the N+ region 82. The resulting structure is shown in FIG. 6C. The screen oxide can be removed from over the drain region by, for example reaction ion etching. A blockout photoresist mask is used (not shown) to blockout the drain section of the structure. The structure is then placed in a reactive ion etching ambient, and the silicon nitride layer 18 is utilized as a mask, together with the blockout photoresist for the reactive ion etch of the polycrystalline silicon region 16 over the area designated as the capacitor of the cell. The resulting structure following the removal of the photoresist blockout mask is shown in FIG. 6D. A thin layer 84 of silicon nitride of the order to about 500 Angstroms is deposited for protection of the capacitor silicon dioxide portion of layer 14 during the subsequent reactive ion etching to form the narrow dimensioned dielectric regions. A blanket layer 86 of insulating material such as silicon dioxide having a thickness of between about 0.8 to 1.2, and preferably 1.0 micrometers is formed over the structure of substantially horizontal and substantially vertical surfaces. The structure is placed in a reactive ion etching ambient for the silicon dioxide layer 86 as described in relation to the earlier embodiments until only the pattern of narrow dimensioned dielectric regions on the vertical sidewalls remain of the pyrolytic silicon dioxide layer 86. The silicon nitride layer 84 is used as the end point detection surface. This resulting structure is shown in FIG. 6E. A plastic material, such as a polyimide, is spun on an etched back to protect the drain and capacitor regions resulting in the protective layers 88, as shown in FIG. 6F. The process for the polyimide protection is identical to that described in regard to the first embodiment of FIGS. 1A through 1F. Reactive ion etching is then used to remove the remaining polycrystalline silicon layer 16 to produce the FIG. 6F structure. The polyimide material protecting the drain and thin capacitor region is removed. The layer 90 of N+ doped polycrystalline silicon of the order of, for example about 400 Angstroms in thickness followed by a blanket deposition of metal of preferably about one micrometer in thickness of an aluminum-copper metal. Using a plastic such as a polyimide as the planarizing media, the metal and the polycrystalline silicon are removed over the pattern of narrow dimensioned dielectric regions 86. The final structure is shown in FIG. 6G, the cross-sectional view, and FIG. 6H, the top view. The FIG. 6G cross-section is taken along line 6G:6G. The drain contact is 92, the storage capacitor contact is 93, the gate electrode is 94 and the metal lones 95 and 96 are either floating, that is not electrically connected, metal lines or metal lines from other devices.

While the invention has been particularly shown and described with reference to the preferred embodiments thereof, it will be understood by those skilled in the art that various changes in form and detail may be made therein without departing from the spirit and scope of the invention. For example, since this technology can be applied to N-channel devices and P-channel devices separately, it is obvious for people skilled in the art to combine the two and develop through some additional steps a complementary MOS self-aligned metal technology.

We claim:

1. A field effect transistor self-aligned dynamic RAM integrated circuit structure comprising:
    a silicon body having said field effect transistor dynamic RAM devices therein with regions of said devices extending to the major surface of said body;
    silicon dioxide regions within said body for isolating groupings of said devices from one another;
    at least some of said groupings of said devices including a PN junction drain and capacitor structure;
    a pattern of narrow dimensioned dielectric regions on said surface of said body; and
    electrical contacts to said drain and capacitor filling the spaces between said narrow dimensioned regions and which contacts are self-aligned to said narrow regions and substantially planar with said narrow regions.

2. The field effect transistor integrated circuit structure of claim 1 wherein said electrical contacts are composed of a first layer of doped polycrystalline silicon and a second layer of metal.

3. A substantially planar self-aligned field effect transistor integrated circuit structure comprising:
    a silicon body;
    a pattern of narrow dimensioned dielectric regions on a major surface of said body;
    a gate dielectric layer on the said surface of said body forming a portion of said field effect transistor structure between certain of said narrow dimensioned regions;
    PN junction regions within said body forming a portion of said field effect transistor structure and in close proximity to and associate with the channel under said gate dielectric layer;
    a layer of doped polycrystalline silicon which is substantially shorter than the height of said certain narrow dimensioned regions on said gate dielectric; and
    metal electrical contacts to said PN junction regions by filling spaces between said pattern of narrow dimensioned region and to said layer of polycrystalline silicon by filling the spaces between said certain of said narrow dimensioned regions which contacts are self-aligned to said narrow regions and substantially planar with the tops of said narrow regions.

4. The integrated circuit structure of claim 3 wherein silicon dioxide regions with said body dielectrically isolates certain of said transistors from similar transistors.

5. The integrated circuit structure of claim 3 wherein said PN junction regions are sources and drains.

* * * * *